US012550690B2

(12) United States Patent
Zhang et al.

(10) Patent No.: US 12,550,690 B2
(45) Date of Patent: Feb. 10, 2026

(54) SEMICONDUCTOR DEVICE HAVING SHALLOW TRENCH ISOLATION STRUCTURES AND FABRICATION METHOD THEREOF

(71) Applicant: YANGTZE MEMORY TECHNOLOGIES CO., LTD., Wuhan (CN)

(72) Inventors: Quan Zhang, Wuhan (CN); Lan Yao, Wuhan (CN); Lu Zhou, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 509 days.

(21) Appl. No.: 18/089,451

(22) Filed: Dec. 27, 2022

(65) Prior Publication Data

US 2023/0126267 A1     Apr. 27, 2023

Related U.S. Application Data

(63) Continuation of application No. PCT/CN2021/125943, filed on Oct. 25, 2021.

(51) Int. Cl.
*H01L 21/762* (2006.01)
*H01L 21/033* (2006.01)
(Continued)

(52) U.S. Cl.
CPC .... *H01L 21/76224* (2013.01); *H01L 21/0332* (2013.01); *H01L 21/308* (2013.01); *H10D 84/834* (2025.01)

(58) Field of Classification Search
CPC .......... H01L 21/0332; H01L 21/76224; H01L 21/76283; H01L 21/76229;
(Continued)

(56) References Cited

U.S. PATENT DOCUMENTS 10,768,222 B1    9/2020  Brozek
2006/0081895 A1  4/2006  Lee et al.
(Continued)

FOREIGN PATENT DOCUMENTS

CN    101097956 A    1/2008
CN    102024819 A    4/2011
(Continued)

OTHER PUBLICATIONS

International Search Report issued in corresponding International Application No. PCT/CN2021/125943, mailed on Feb. 11, 2022, 7 pages.

(Continued)

*Primary Examiner* — Sonya McCall-Shepard
(74) *Attorney, Agent, or Firm* — BAYES PLLC

(57) ABSTRACT

A method of fabricating a semiconductor device includes forming a first shallow trench isolation structure in a first region of a substrate and second shallow trench isolation structures in a second region of the substrate. The method also includes forming a mask layer over the substrate, the first shallow trench isolation structure, and the second shallow trench isolation structures. The method further includes etching the mask layer and second shallow trench isolation structures in the second region sequentially to form a semiconductor protrusion between the second shallow trench isolation structures.

20 Claims, 10 Drawing Sheets

(51) Int. Cl.
*H01L 21/308* (2006.01)
*H10D 30/01* (2025.01)
*H10D 84/01* (2025.01)
*H10D 84/03* (2025.01)
*H10D 84/83* (2025.01)
*H10D 84/85* (2025.01)

(58) Field of Classification Search
CPC ......... H01L 21/027–0338; H01L 21/32; H01L 21/308–3086; H01L 21/31; H01L 21/311; H01L 21/31144; H10D 84/0188; H10D 84/0151; H10D 30/6211–6213; H10D 84/0158; H10D 84/0193; H10D 84/834; H10D 84/853; H10D 86/011; H10D 86/215; H10D 84/856; H10B 12/36; H10B 12/056
See application file for complete search history.

(56) References Cited

U.S. PATENT DOCUMENTS

| | | | |
|---|---|---|---|
| 2013/0052781 A1* | 2/2013 | Dai | ............... H10D 86/011 438/275 |
| 2017/0053906 A1 | 2/2017 | Or-Bach et al. | |
| 2019/0051526 A1* | 2/2019 | Khang | ............... H10D 84/0172 |
| 2019/0081068 A1 | 3/2019 | Huang et al. | |

FOREIGN PATENT DOCUMENTS

| | | |
|---|---|---|
| CN | 103137621 A | 6/2013 |
| CN | 103904116 A | 7/2014 |
| CN | 104124210 A | 10/2014 |
| CN | 104517888 A | 4/2015 |
| CN | 104752215 A | 7/2015 |
| CN | 109216433 A | 1/2019 |
| CN | 110729300 A | 1/2020 |
| CN | 112103347 A | 12/2020 |
| JP | 2011181841 A | 9/2011 |
| KR | 100683491 B1 | 2/2007 |

OTHER PUBLICATIONS

International Search Report issued in corresponding International Application No. PCT/CN2021/103677, mailed Feb. 10, 2022, 4 pages.

* cited by examiner

SEMICONDUCTOR DEVICE HAVING SHALLOW TRENCH ISOLATION STRUCTURES AND FABRICATION METHOD THEREOF

CROSS-REFERENCE OF RELATED APPLICATIONS

This application is a continuation of International Application No. PCT/CN2021/125943, filed on Oct. 25, 2021, which claims the benefits of priorities to International Application No. PCT/CN2021/093323, filed on May 12, 2021 and International Application No. PCT/CN2021/103677, filed on Jun. 30, 2021, both entitled "MEMORY PERIPHERAL CIRCUIT HAVING THREE-DIMENSIONAL TRANSISTORS AND METHOD FOR FORMING THE SAME," all of which are incorporated herein by reference in their entireties.

TECHNICAL FIELD

The present disclosure relates to the field of semiconductor technology, particularly to a semiconductor device and a fabrication method thereof.

BACKGROUND

A semiconductor device of an existing integrated circuit typically includes a high-voltage device region and a low-voltage device region, both of which use planar transistors. With the rapid development of Complementary Metal Oxide Semiconductor (CMOS) processes, there is an increasing demand for integrated circuits with higher integration and performance, and correspondingly the semiconductor device is required to have smaller characteristic sizes, which, when scaled down to 22 nm, may cause severe short channel effect in the planar transistor structure and affect device performance badly.

SUMMARY

The present disclosure provides a method of fabricating a semiconductor device. The method includes providing a substrate including a first region and a second region; forming a first shallow trench isolation structure in the first region and at least two second shallow trench isolation structures in the second region in the substrate; forming a second mask layer over the substrate, the first shallow trench isolation structure and the at least two second shallow trench isolation structures; and etching the second mask layer and the at least two second shallow trench isolation structures in the second region sequentially to form a semiconductor protrusion between the two adjacent second shallow trench isolation structures.

In some implementations, a first mask layer is formed on the substrate, and the etching the second mask layer and the at least two second shallow trench isolation structures in the second region sequentially includes: forming a second layer of photoresist on the second mask layer; etching the second layer of photoresist and the second mask layer in the second region sequentially until the first mask layer and the at least two second shallow trench isolation structures in the second region are exposed; removing the second layer of photoresist in the first region; and etching the at least two shallow trench isolation structures using the exposed first mask layer and the second mask layer remained in the second region as a mask.

In some implementations, the forming the second layer of photoresist on the second mask layer includes forming a protecting layer on the second mask layer; and forming the second layer of photoresist on the protecting layer.

In some implementations, a first device oxide layer in the first region and a second device oxide layer in the second region are formed between the substrate and the first mask layer, and after etching the at least two second shallow trench isolation structures, the method further includes: removing the first mask layer and the remaining second mask layer; and forming a supplement oxide layer on both sides of the semiconductor protrusion to prolong the second device oxide layer.

In some implementations, the second mask layer is silicon nitride or polysilicon, and when the second mask layer is polysilicon, the removing the first mask layer and the remaining second mask layer includes: doping both sides of the semiconductor protrusion with carbon or germanium; and removing the remaining second mask layer and the first mask layer sequentially.

In some implementations, the doping both sides of the semiconductor protrusion with carbon includes: forming a third mask layer on the remaining second mask layer; and doping both sides of the semiconductor protrusion with carbon or germanium using the first mask layer in the second region and the third mask layer as a mask.

In some implementations, after the forming the supplement oxide layer on both sides of the semiconductor protrusion to prolong the second device oxide layer, the method further includes: forming a first gate layer on the first device oxide layer; and forming a second gate layer on the prolonged second device oxide layer.

In some implementations, the thickness of the first device oxide layer in a first direction is larger than the thickness of the second device oxide layer in the first direction.

In some implementations, forming the first shallow trench isolation structure in the first region and the at least two second shallow trench isolation structures in the second region in the substrate includes: forming an isolation trench in the substrate, the isolation trench including a first sub isolation trench in the first region and at least two second sub isolation trenches in the second region; and filling the isolation trench with an isolation material to form the first shallow trench isolation structure and the at least two second shallow trench isolation structures in the first region and the second region, respectively.

In some implementations, the filling the isolation trench with the isolation material includes depositing the isolation material in the isolation trench and on the first mask layer to fully fill the isolation trench; and planarizing the isolation material to make the isolation material in the isolation trench flush with the first mask layer.

In some implementations, the material of the first mask layer is silicon nitride.

In some implementations, the second mask layer is silicon nitride or polysilicon, and when the second mask layer is polysilicon, the forming the second mask layer over the substrate, the first shallow trench isolation structure, and the at least two second shallow trench isolation structures includes: forming a buffer layer over the first mask layer, the first shallow trench isolation structure and the at least two second shallow trench isolation structures; and forming the second mask layer on the buffer layer.

In some implementations, the thickness of the buffer layer ranges from 8 nm to 9 nm.

In some implementations, the first region is used to form a planar transistor, and the second region is used to form a FinFET.

In some implementations, the first shallow trench isolation structure is above the substrate, which in turn is above the trench isolation structures.

In the second aspect, the present disclosure also provides a semiconductor device. The semiconductor device includes a substrate including a first region and a second region; a first shallow trench isolation structure in the first region and at least two second shallow trench isolation structures in the second region, wherein a semiconductor protrusion is disposed between the two adjacent second shallow trench isolation structures; a first device oxide layer in the first region and a second device oxide layer in the second region that covers the semiconductor protrusion; and a first gate layer on the first device oxide layer and a second gate layer on the second device oxide layer.

In some implementations, the first region is used to form a planar transistor, and the second region is used to form a FinFET.

In some implementations, the first shallow trench isolation structure is above the substrate, which in turn is above the second shallow trench isolation structures.

In some implementations, the thickness of the first device oxide layer in a first direction is larger than the thickness of the second device oxide layer in the first direction.

BRIEF DESCRIPTION OF ACCOMPANYING DRAWINGS

Figure 5A:
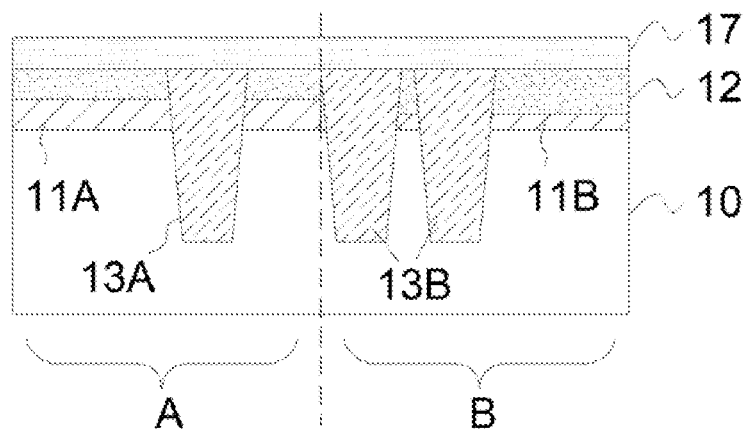
Figure 5B:
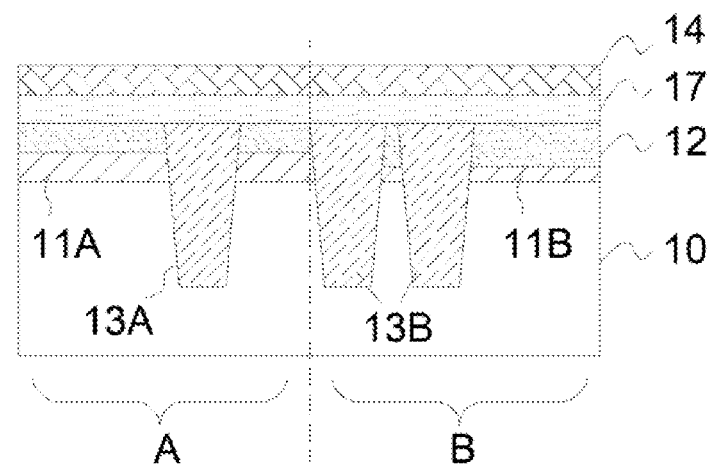
Figure 6A:
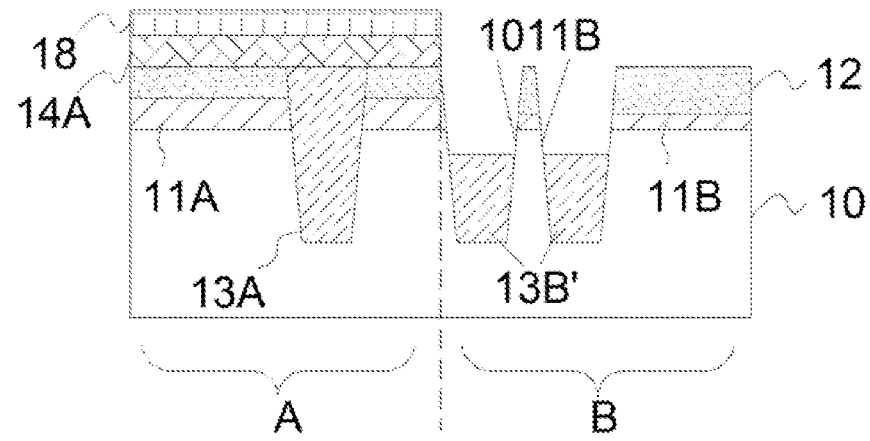
Figure 6B:
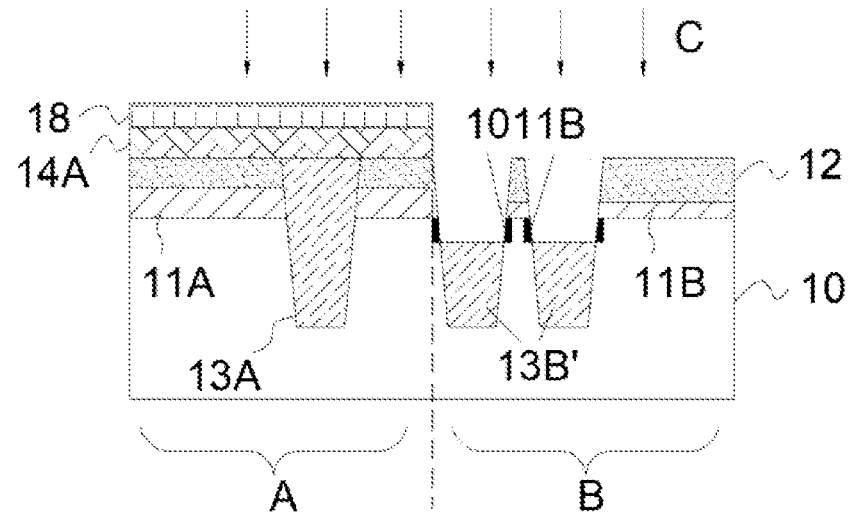

FIGS. 5A-5B are cross-sectional structure diagrams of a semiconductor device during the formation of a buffer layer, when the second mask layer is polysilicon, provided in an implementation of the present disclosure; and FIGS. 6A-6B are cross-sectional structure diagrams of a semiconductor device during the phase of doping, when the second mask layer is polysilicon, provided in an implementation of the present disclosure.

DETAILED DESCRIPTION

The technical solutions in implementations of the present disclosure will be described clearly and fully below in connection with accompanying drawings of the implementations of the present disclosure. Obviously, the implementations to be described are only some, not all, implementations of the present disclosure. All other implementations obtained by those skilled in the art based on the implementations of the present disclosure without any creative works fall within the scope claimed by the present disclosure.

In the description of the present disclosure, it is understood that orientation and position relationships indicated by terms "center," "longitudinal," "traverse," "length," "width," "thickness", "upper", "lower", "front", "back", "left", "right", "vertical", "horizontal", "top", "bottom," "inner," "outer," "clockwise," and "counter-clockwise" are those based on the drawings and only for the purpose of facilitating the description of the present disclosure and simplifying the description rather than to indicate or imply that the indicated apparatus or element must have a specific direction, and is constructed and operated in the specific direction. Thus, they shall not be understood as a limitation to the present disclosure. Moreover, the terms "first," "second," etc., are only used for the purpose of description and should not be understood to indicate or imply relative importance or to designate the number of the referenced technical features implicitly. Therefore, the features limited by "first" or "second" may include one or more of the features explicitly or implicitly. In the description of the present disclosure, the meaning of "a plurality of" is two or more unless otherwise defined explicitly.

In the description of the present disclosure, it is noted that the terms "mount," "interconnect," and "connect" should be explained broadly. They may be, for example, fixed connection, removable connection or integral connection; mechanical connection, electrical connection, or mutual communication; direct interconnection or indirect interconnection with intermediate medium; or inner communication or interaction between two elements, unless otherwise specified or defined expressly. For those skilled in the art, specific meanings of the above terms in the present disclosure may be understood depending on specific situations.

In the present disclosure, a first feature being "over" or "under" a second feature may include that the first feature is in direct contact with the second feature, or the first and second features are not directly contacted but contacted through other feature(s) between them, unless otherwise specified or defined expressly. Moreover, a first feature being "over," "above," or "on" a second feature includes the first feature being directly or obliquely above the second feature, or only means that the first feature is at a level higher than the second feature. A first feature being "under," "below," or "beneath" a second feature includes the first feature being directly or obliquely below the second feature, or only means that the first feature is at a level lower than the second feature.

The disclosure below provides many different implementations or examples for implementing different structures of the present disclosure. To simplify the present disclosure, components and configurations of specific examples will be described hereafter. Of course, they are only exemplary and not intended to limit the present disclosure. Moreover, in the present disclosure, reference numerals or characters may be used repeatedly in different examples. The repetition is for the purpose of a simple and clear description rather than indicating any relationships between the various implementations and/or configurations in discuss. Moreover, although specific examples of various processes and materials may be provided in the present disclosure, it can be realized by those skilled in the art that other processes and/or materials may be used.

A semiconductor device in an existing integrated circuit typically includes a high-voltage device region and a low-voltage device region, both of which use planar transistors. With the rapid development of Complementary Metal Oxide Semiconductor (CMOS) processes, there is an increasing demand for integrated circuits with higher integration and performance, and correspondingly the semiconductor device is required to have smaller characteristic sizes, which, when scaled down to 22 nm, may cause severe short channel effect in the planar transistor structures and affect device performance badly. To solve this problem, a Fin Field-Effect Transistor (FinFET) is used instead in the existing low-voltage device region, while the planar transistor is still used in the high-voltage device region due to the great difficulty of the process of forming FinFET satisfying the performance requirements of the high-voltage device region.

In an existing semiconductor device, since the shallow trench isolation structure in the high-voltage device region and the shallow trench isolation structure in the low-voltage device region are formed simultaneously, the structure of the shallow trench isolation structure in the high-voltage device region is the same as that of the shallow trench isolation structure in the low-voltage device region. However, when FinFET is used instead in the low-voltage device region while the planar transistor is still used in the high-voltage device region, because of the different requirements of the planar transistors and FinFET for shallow trench isolation structure, the existing forming methods can not satisfy practical needs.

The present disclosure provides a semiconductor structure and a fabrication method thereof to effectively solve the problem that the existing shallow trench isolation structure can not satisfy the requirements of different regions in a semiconductor device simultaneously.

Figure 1:
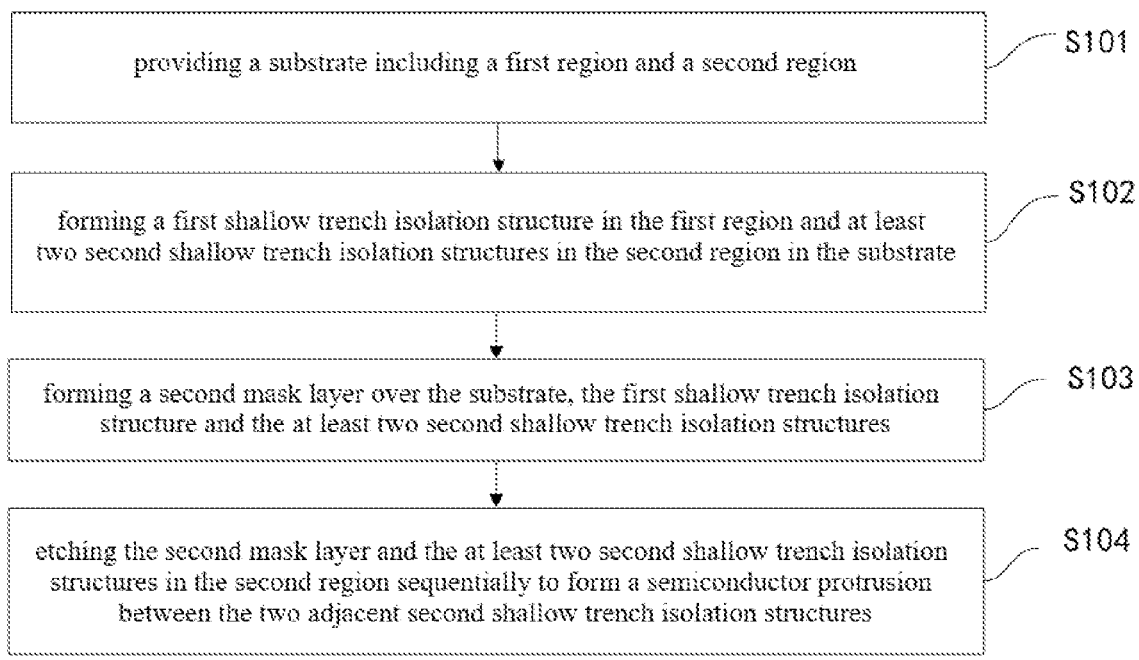
FIG. 1 is a flowchart of a method of fabricating a semiconductor device provided in an implementation of the present disclosure.

Refer to FIG. 1, which is a flowchart of a method of fabricating a semiconductor device provided in an implementation of the present disclosure. A specific flow of the fabrication method may be as follows.

Figure 4A:
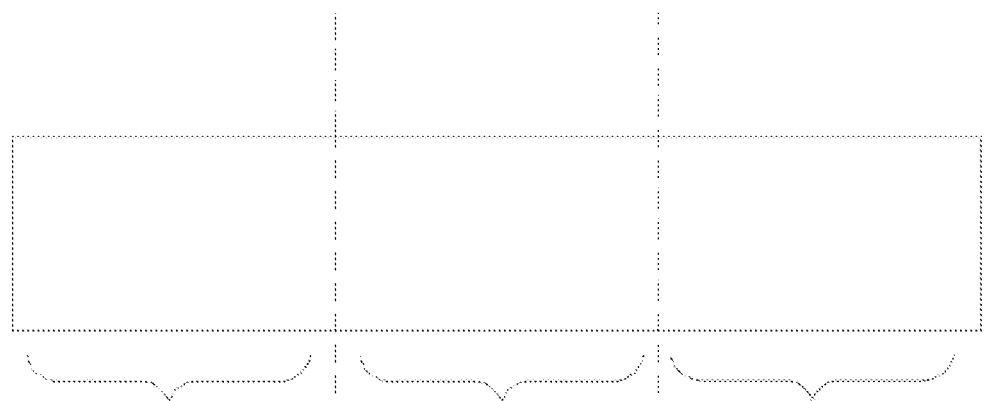
FIGS. 4A-4P are cross-sectional structure diagrams of a semiconductor device in various phases in an implementation of the present disclosure.

In step S101, a substrate including a first region and a second region is provided. The cross-sectional structure diagram after completing step S101 is shown in FIG. 4A.

Figure 4B:
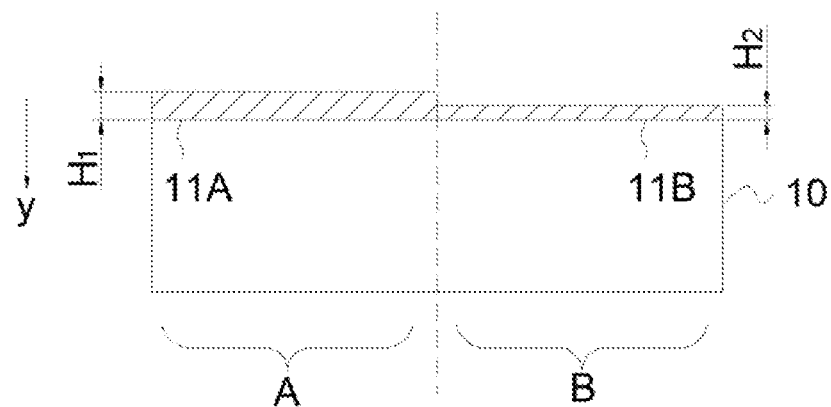

Specifically, the substrate 10 may be a semiconductor material, for example, silicon, germanium, silicon-on-insulator (SOI), or the like. In this implementation, the substrate 10 may include a first region (region A) and a second region (region B), wherein the region A includes a high-voltage device region and may be used to form the planar transistor in accordance with the implementation of the present disclosure, and the region B includes a low-voltage device region (the devices therein having an operating voltage lower than that of the devices in the high-voltage device region) that further includes a first low-voltage zone b1 and a second low-voltage zone b2. The operating voltage of devices (such as transistors or CMOS transistors) in the high-voltage device region, the first low-voltage region, and the second low-voltage region can decrease in sequence. In this implementation, to simplify the illustration, in the figures after FIG. 4A, zones b1 and b2 are generally designated by the region B. Specifically, the region B may be one low-voltage device region or may include both the zone b1 and the zone b2. FIGS. 4B-4O will be described with the region B including one low-voltage device region taken as an example. The region B is used to form the FinFET in accordance with the implementation of the present disclosure. In the FinFET, the gate may surround the channel on three sides, so that the area of the gate to control the channel is increased and thus the control ability of the gate is greatly enhanced. As a result, short channel effect may be inhibited effectively, and sub-threshold leakage current may be reduced. The performance of different device regions can be adjusted by changing the channel width of one or more transistors inside the device, and the channel width of the FinFET is in direct proportion to the height of its fin. Since the high-voltage device region requires relatively high driving voltage, the fin of the corresponding FinFET will be relatively high. It is difficult to form gate structure surrounding the higher fin on three sides, and as a result, the planar transistor is still used in the region A.

As shown in FIG. 4B, a first device oxide layer 11A in the first region and a second device oxide layer 11B in the second region are formed on the substrate 10, and the thickness $H_1$ of the first device oxide layer 11A in a first direction (the y direction in the figure) is larger than the thickness $H_2$ of the second device oxide layer 11B in the first direction.

Specifically, in this implementation, the first device oxide layer 11A and the second device oxide layer 11B are formed using processes including thermal oxidation, soft plasma oxidation, or UV photo assistant oxidation. When the substrate 10 is a silicon or germanium substrate as an option in this example, optionally, the first device oxide layer 11A and the second device oxide layer 11B may be formed simultaneously. At this point, both of the first device oxide layer 11A and the second device oxide layer 11B have the composition which is silicon oxide or germanium oxide. The first device oxide layer 11A and the second device oxide layer 11B may have different compositions depending on whether the region A or region B of the substrate has been doped in advance. For example, the second device oxide layer 11B may be silicon oxide without chlorine, while the first device oxide layer 11A may be silicon oxide containing chlorine. The first device oxide layer 11A, and the second device oxide layer 11B are used as the gate oxide layers of the high-voltage device and the low-voltage device, respectively. Since the low-voltage device and high-voltage device have different requirements with respect to breakdown voltage, in order to avoid too big a leakage current in the high-voltage device region, the thickness $H_1$ of the first device oxide layer 11A in the first direction (the y direction in the figure), i.e., in the direction of the thickness of the substrate 10, is larger than the thickness $H_2$ of the second device oxide layer 11B in the first direction. To achieve their corresponding relationship in thickness, the first device oxide layer 11A and the second device oxide layer 11B may be formed in the same step or in separate steps. When they are formed in the same step, the region A is doped with chlorine ions in advance, and oxidation of the substrate 10 in the region A is accelerated due to the doping of chloride ions in the region A. As a result, the first device oxide layer 11A is formed to be thicker than the second device oxide layer 11B for the same amount of time. When they are formed in separate steps, in the first step, the device oxide layer with the same thickness is formed in both the first region and the second region under the same time and process conditions; and in the second step, the device oxide layer in the second region is selected to be etched, making the thickness of the second device oxide layer in the second region smaller than the thickness of the first device oxide layer in the first region.

Figure 4C:
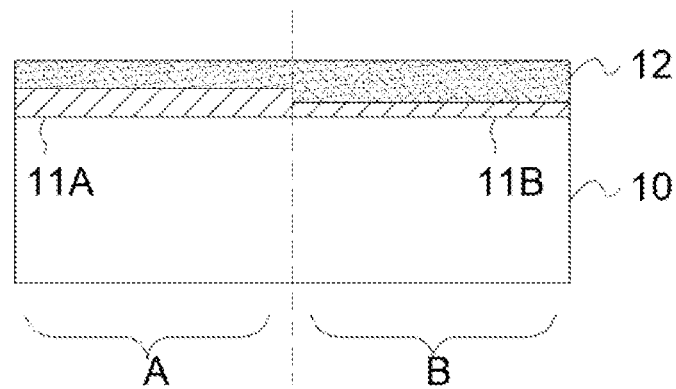

As shown in FIG. 4C, a first mask layer 12 on the first device oxide layer 11A and the second device oxide layer 11B is also formed on the substrate 10.

Specifically, the first mask layer 12 may be a hard mask layer, which is used to transfer the particular pattern of photoresist onto the substrate. That is, the particular pattern may first be transferred from the photoresist onto the hard mask layer, and has a good conforming capability because the hard mask layer has hard and compact property, and then the pattern is transferred, by etching, from the hard mask layer onto the substrate 10, so that the pattern finally obtained is relatively complete. The material of the first mask layer 12 may be selected from silicon nitride or titanium nitride. Moreover, it is noted that the first device oxide layer 11A and the second device oxide layer 11B may help to alleviate the stress on the substrate 10 from the formation of the silicon nitride layer (i.e., the first mask layer 12). In this example, the silicon nitride layer is formed by an LPCVD process.

In step S102, a first shallow trench isolation structure in the first region and at least two second shallow trench isolation structures in the second region are formed in the substrate.

Figure 2:
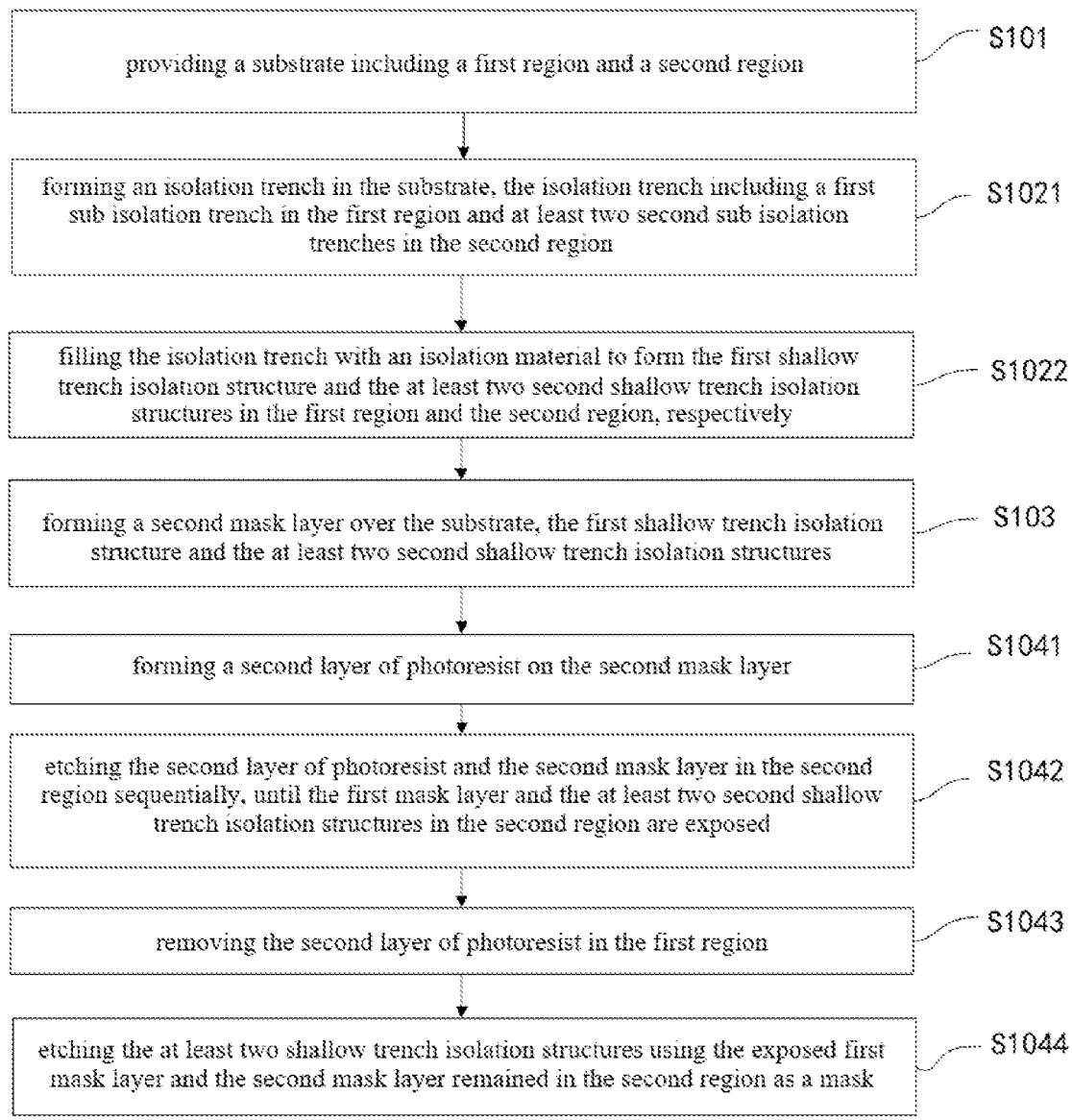
FIG. 2 is a flowchart of another method of fabricating a semiconductor device provided in an implementation of the present disclosure.

Specifically, refer to FIG. 2, which is a flowchart of another method of fabricating a semiconductor device provided in an implementation of the present disclosure. The step S102 may specifically include the steps as follows.

In step S1021, an isolation trench is formed in the substrate, the isolation trench including a first sub isolation trench in the first region and at least two second sub isolation trenches in the second region.

Figure 4D:
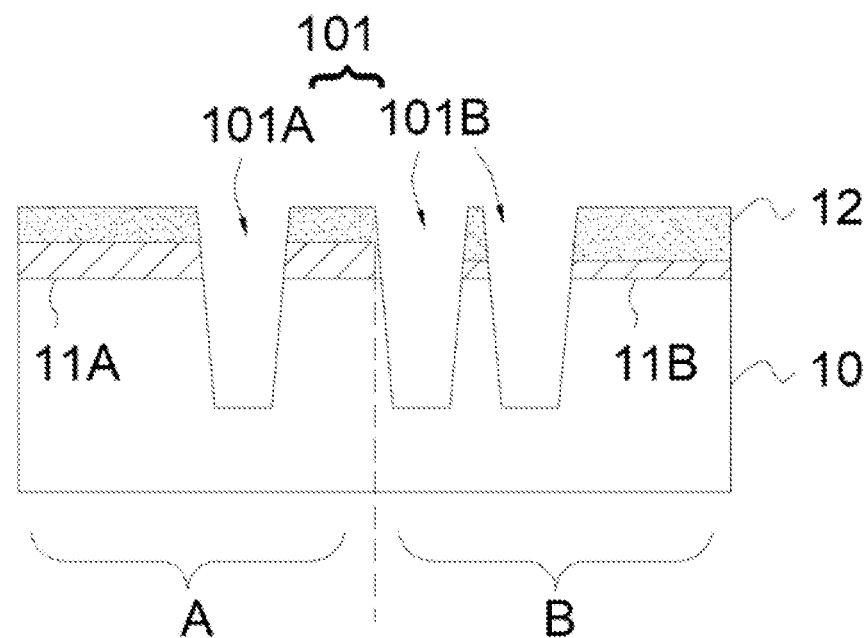

The cross-sectional structure diagram after completing step S1021 is shown in FIG. 4D.

The isolation trench 101 is used to prevent electrical coupling between transistor structures when fully filled with dielectric materials. A first layer of photoresist (not shown in the figures) may be coated on the surface of the first mask layer 12 and go through the photolithography process, such as exposure, development or the like, to form a photoresist pattern that defines the position of the isolation trench 101 and has openings. Subsequently, the first mask layer 12, the first device oxide layer 11A, and the second device oxide layer 11B are etched through the openings in the first layer of photoresist using reactive ion etching or plasma etching to expose the surface of the substrate 10. Then the substrate 10 masked by the first mask layer 12 is etched using a fluorine-containing etching gas to form the isolation trench 101 in the substrate 10 that includes the first sub isolation trench 101A in the region A and at least two second sub isolation trenches 101B in the region B. As an option, the first sub isolation trench 101A and the at least two second sub isolation trenches 101B may be formed in the same etching process and thus have the same height in the first direction. As another option, the first sub isolation trench 101A and the second sub isolation trenches 101B can be formed in different etching processes, and thus have different heights in the first direction, which can be configured respectively according to their different requirements of electrical isolation.

In step S1022, the isolation trench is filled with an isolation material to form the first shallow trench isolation structure and the at least two second shallow trench isolation structures in the first region and the second region, respectively.

Specifically, step S1022 may include depositing the isolation material in the isolation trench and on the first mask layer to fully fill the isolation trench; and planarizing the isolation material to make the isolation material in the isolation trench flush with the first mask layer.

Figure 4E:
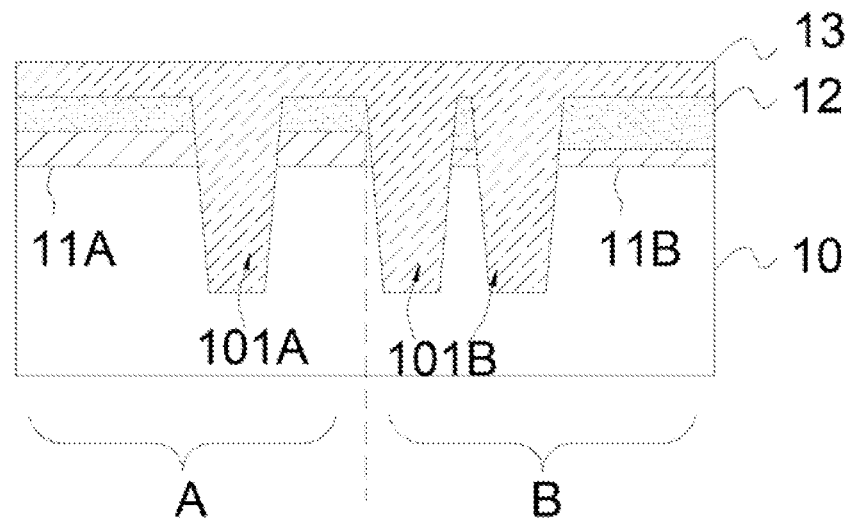
Figure 4F:
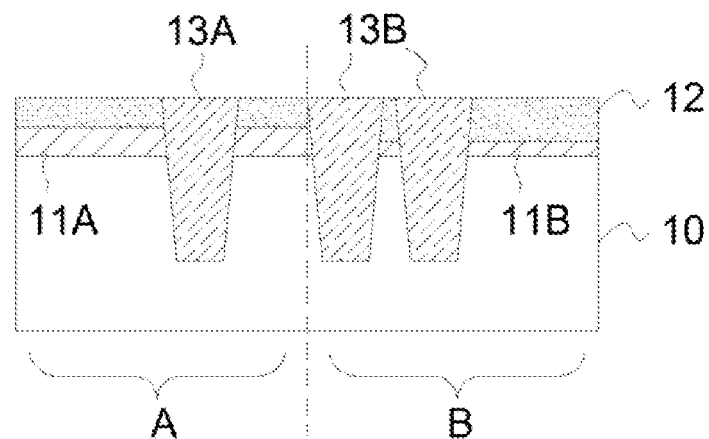

Specifically, as shown in FIG. 4E, the isolation material 13 is deposited in the isolation trench 101 and on the first mask layer 12 using high density plasma chemical vapor deposition to fully fill the isolation trench 101, and then planarized using a planarization process (e.g., chemical mechanical polishing process) to make the isolation material 13 in the isolation trench 101 flush with the first mask layer 12. At this point, the first shallow trench isolation structure 13A is flush with the second shallow trench isolation structures 13B, and the first mask layer 12 is also used as a stop layer in the planarization process. The cross-sectional structure diagram after completing step S1022 is shown in FIG. 4F. In this implementation, optionally, the first shallow trench isolation structure 13A and the second shallow trench isolation structures 13B may be formed in the same process step or in different process steps. Because the heights of the first sub isolation trench 101A and the second sub isolation trenches 101B may be the same or different, the first shallow trench isolation structure 13A and the second shallow trench isolation structures 13B may have the same or different height, which may be configured according to their different requirements of electrical isolation.

Figure 4G:
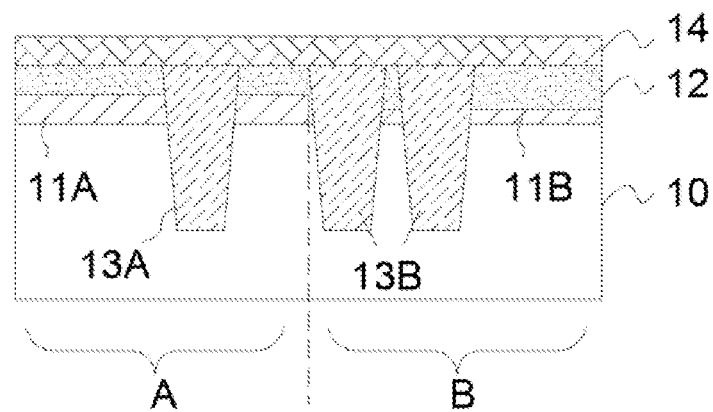

In step S103, a second mask layer is formed over the substrate, the first shallow trench isolation structure, and the at least two shallow trench isolation structures. The cross-sectional structure diagram after completing step S103 is shown in FIG. 4G.

Specifically, the second mask layer 14 may be a hard mask layer with its material being silicon nitride or polysilicon. When the second mask layer 14 is the silicon nitride layer as an option, peeling defects of the hard mask layer may be avoided in etching, and in this implementation, the silicon nitride layer may be formed using an LPCVD process. In addition, with the second mask layer 14 being the silicon nitride layer as an option, when the silicon nitride layer is etched with an inert gas, the byproducts resulting from the reaction between the gas and silicon nitride may result in pin holes in the silicon nitride layer, and cause damage to the first device oxide layer and/or the second device oxide layer. Therefore, in this implementation, the material of the second mask layer 14 may be polysilicon as an option to avoid this phenomenon. When the second mask layer is another material, the forming process and the subsequent removing process of the second mask layer 14 are also different. For example, when the material of the second mask layer 14 is polysilicon, refer to FIGS. 5A and 5B, step S103 may specifically include: forming a buffer layer 17 over the first mask layer, the first shallow trench isolation structure, and the at least two shallow trench isolation structures with the structure obtained after completing this step being shown in FIG. 5A; and forming the second mask layer 14 on the buffer layer with the structure obtained after completing this step being shown in FIG. 5B. The buffer layer 17 is used for better bonding of the second mask layer 14 having polysilicon as its material to the first mask layer 12.

Optionally, the material of the buffer layer 17 may be silicon oxide or any other material that can facilitate the bonding of the second mask layer 14 having polysilicon as its material to the first mask layer 12. In some implementations, the thickness of the buffer layer 17 may range from 8 nm to 9 nm.

In step S104, the second mask layer in the second region and the at least two second shallow trench isolation structures are etched sequentially so as to form a semiconductor protrusion between the two adjacent second shallow trench isolation structures.

Refer to FIG. 2, which is a flowchart of another method of fabricating a semiconductor device provided in an implementation of the present disclosure. The step S104 may specifically include the steps as follows.

Figure 4H:
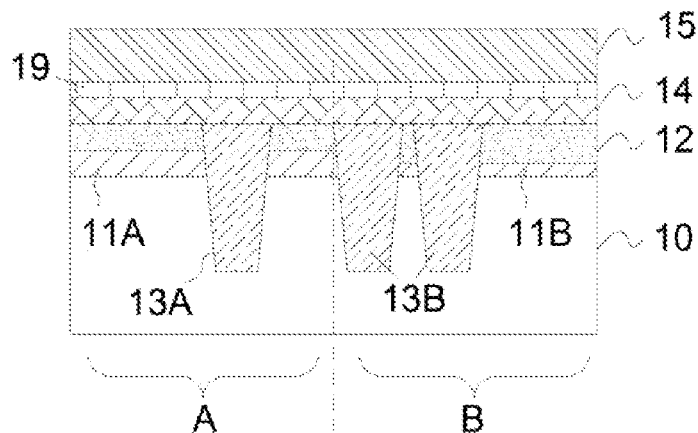

In step S1041, a second layer of photoresist is formed on the second mask layer. The cross-sectional structure diagram after completing step S1041 is shown FIG. 4H. In this implementation, when the material of the second mask layer 14 is silicon nitride as an option, in order to avoid causing "intoxication" of the silicon nitride material on the second layer of photoresist 15, i.e. in order to avoid the influence of the silicon nitride material on the topography of the second layer of photoresist 15, before forming the second layer of photoresist 15, a protective layer 19 can be formed in advance. In some implementations, the material of the protective layer 19 is silicon oxide for avoiding the influence of silicon nitride material on the second layer of photoresist. The second layer of photoresist 15 may be the photoresist including positive photoresist or negative photoresist. Therefore, the step S1061 may specifically include: forming the protecting layer on the second mask layer; and forming the second layer of photoresist on the protecting layer.

In step S1042, the second layer of photoresist and the second mask layer in the second region are etched sequentially, until the first mask layer and the at least two second shallow trench isolation structures in the second region are exposed. The cross-sectional structure diagram after completing step S1042 is shown FIG. 4J.

Figure 4I:
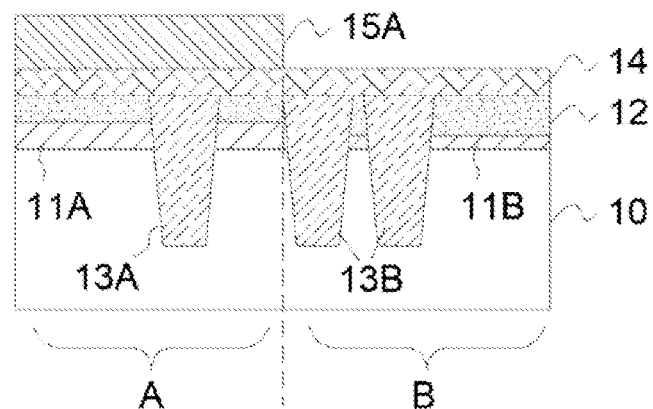
Figure 4J:
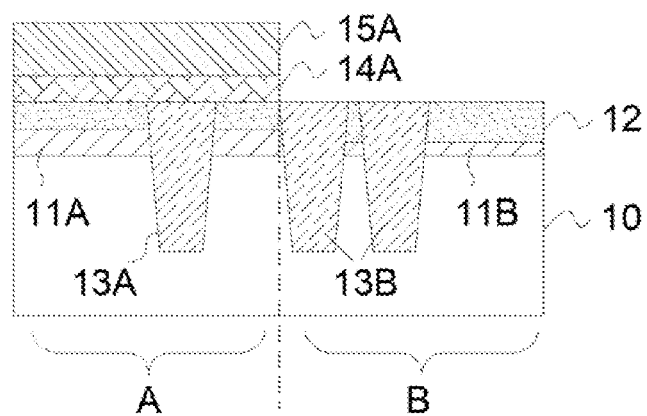

Specifically, as shown in FIG. 4I, the second layer of photoresist 15 may go through the photolithography process, such as exposure, development or the like, to form the second layer of photoresist 15A defining the pattern of the region B, according to which the second mask layer 14 is etched. Specifically, the second mask layer 14 may be etched according to the pattern using reactive ion etching or plasma etching process, until the first mask layer 12 and the at least two second shallow trench isolation structures 13B in the region B are exposed, as shown in FIG. 4J.

Figure 4K:
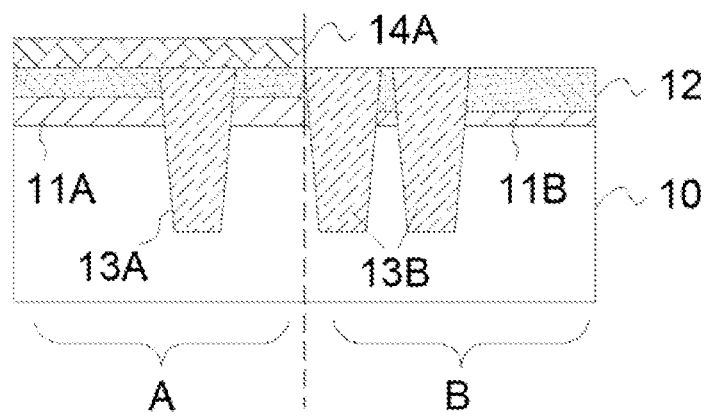

In step S1043, the second layer of photoresist in the first region is removed. The cross-sectional structure diagram after completing step S1043 is shown FIG. 4K, and the second layer of photoresist 15A in the region A is removed by way of exposure and developing.

Figure 4L:
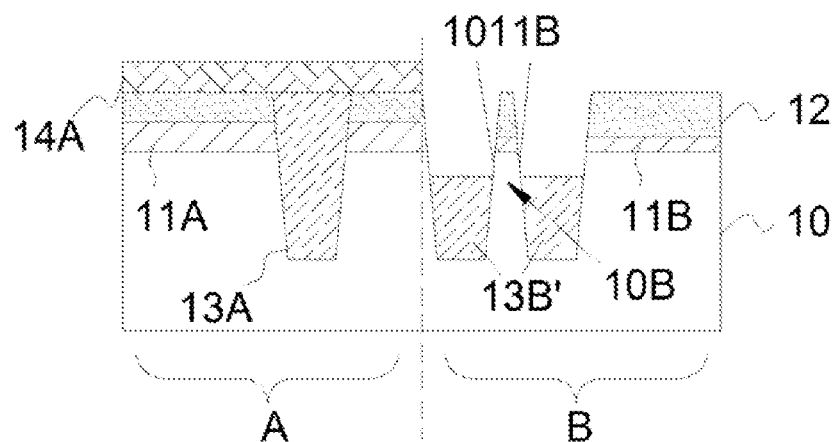

In step S1044, with the exposed first mask layer and the second mask layer remaining in the second region serving as a mask, the at least two shallow trench isolation structures are etched. The cross-sectional structure diagram after completing step S1044 is shown FIG. 4L.

Specifically, in step S1042, after etching the second mask layer 14 in the region B, the region A may have the second mask layer 14A remaining therein, which can protect the first shallow trench isolation structure 13A when the at least two second shallow trench isolation structures 13B are etched. Meanwhile, the exposed first mask layer 12 may prevent structures in the region B other than the second shallow trench isolation structures 13B from being etched. Moreover, when the first shallow trench isolation structure 13A and the second shallow trench isolation structures 13B are configured to have the same height, the trench isolation structures 13B' obtained after etching the second shallow trench isolation structures 13B have a height smaller than that of the first shallow trench isolation structure 13A. Furthermore, in this implementation, the second shallow trench isolation structures 13B are etched below the substrate 10. As a result, the first shallow trench isolation structure 13A is above the substrate 10, which in turn is above the trench isolation structures 13B', so that the portion of the substrate 10 protruding from two adjacent trench isolation structures 13B' functions as a fin for FinFET in the region B, i.e., the semiconductor protrusion 10B in the region B functions as the fin for FinFET.

Figure 3:
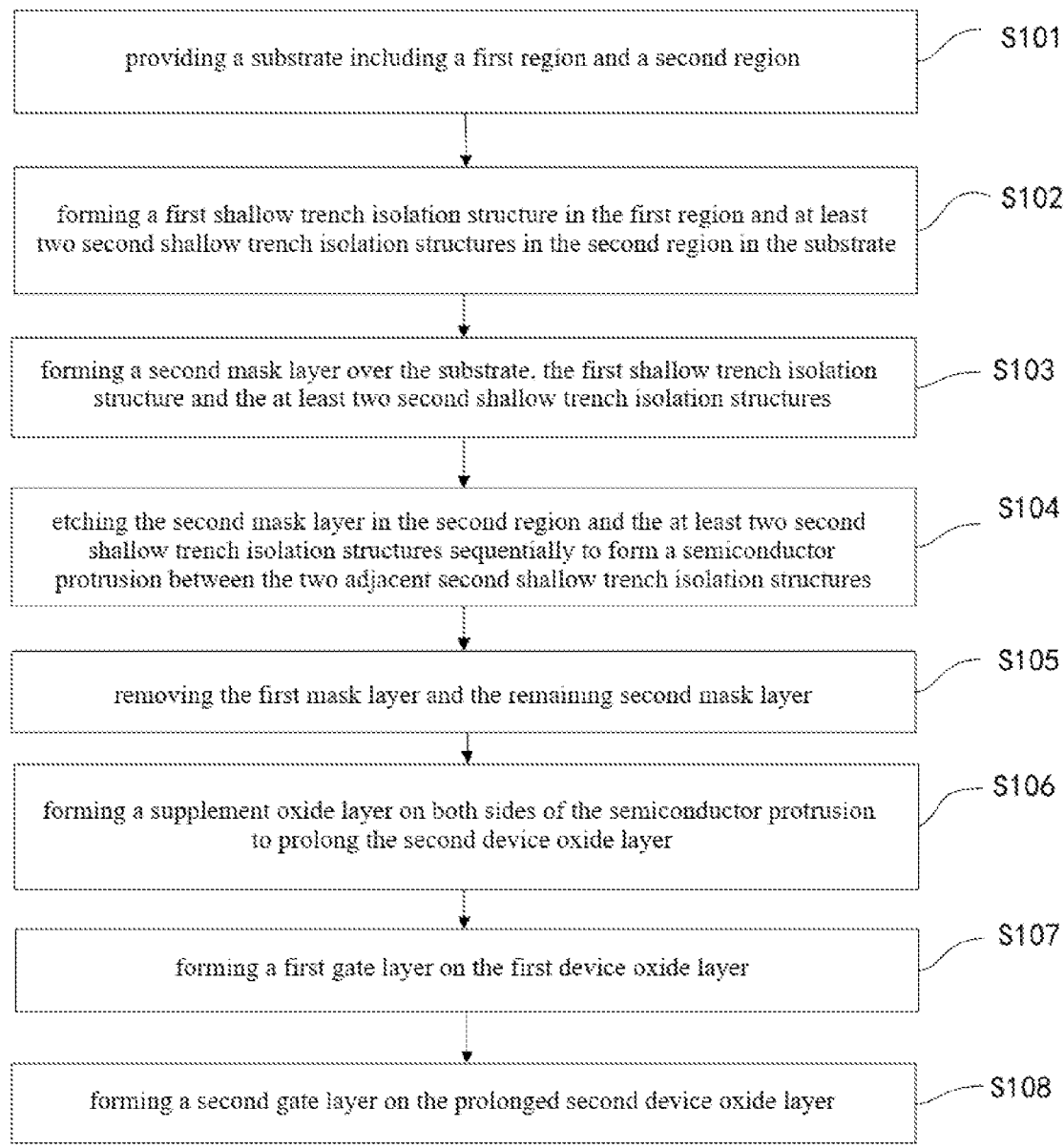
FIG. 3 is a flowchart of yet another method of fabricating a semiconductor device provided in an implementation of the present disclosure.

Referring to FIG. 3, after step S104, the method further includes step S105, in which the first mask layer and the remaining second mask layer are removed.

Figure 4M:
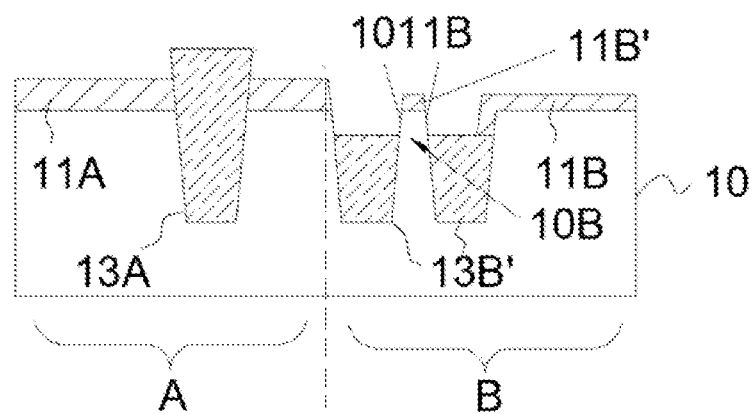

The cross-sectional structure diagram after completing step S105 is shown FIG. 4M. After completing step S105, the top of semiconductor protrusion 10B is covered by a portion 11B' of the second device oxide layer. In this implementation, when the first mask layer 12 and the remaining second mask layer 14A are both silicon nitride, they can be removed with a wet etching method using hot phosphoric acid. It is noted that, in this implementation, when the second mask layer 14 is polysilicon and the first mask layer 12 is silicon nitride, the second mask layer 14A in the first region may be first removed using tetramethylammonium hydroxide (TMAH) solution and then the remaining first mask layer 12 may be removed using hot phosphoric acid. Since TMAH is highly corrosive for both polysilicon and single crystal silicon, in order to avoid severe damage to the semiconductor protrusion 10B in the region B when the second mask layer 14A is removed by a wet process, in this implementation, as shown in FIG. 2, the step S105 may specifically include: doping both sides of the semiconductor protrusion with carbon or germanium; and removing the remaining second mask layer and the first mask layer sequentially.

Since the etching using the TMAH solution on both sides 1011B of the semiconductor protrusion doped with carbon is slowed down greatly, the fin may be protected by the step of carbon doping; and the same is true for germanium.

Refer to FIGS. 6A and 6B, the step of doping both sides 1011B of the semiconductor protrusion with carbon or germanium includes forming a third mask layer on the remaining second mask layer; and doping both sides of the semiconductor protrusion with carbon or germanium using the first mask layer in the second region and the third mask layer as the mask.

In this implementation, the third mask layer 18 is photoresist, which functions as a mask to prevent the second mask layer 14A having polysilicon as its material from being doped with carbon or germanium. As a result, when the second mask layer 14A is removed using TMAH solution, it is etched at a speed much greater than the speed at which the portions of the isolation trench sidewalls 1011B are etched, because the second mask layer 14A is not doped with carbon or germanium. Therefore, the fin may be protected at the portions of the isolation trench sidewalls 1011B by the step of carbon or germanium doping, while the insulation performance of other structures, such as the second shallow trench isolation structures 13B' in the region B, will not be affected due to the doping of carbon or germanium.

In step S106, a supplement oxide layer is formed on both sides of the semiconductor protrusion to prolong the second device oxide layer.

Figure 4N:
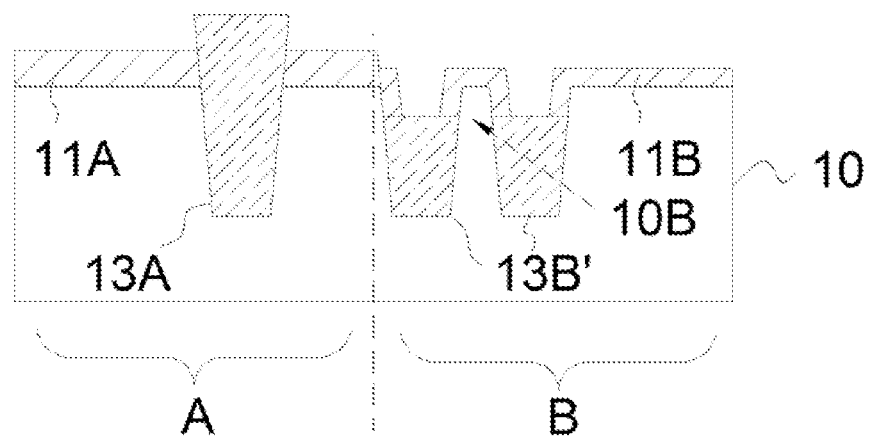
Figure 4O:
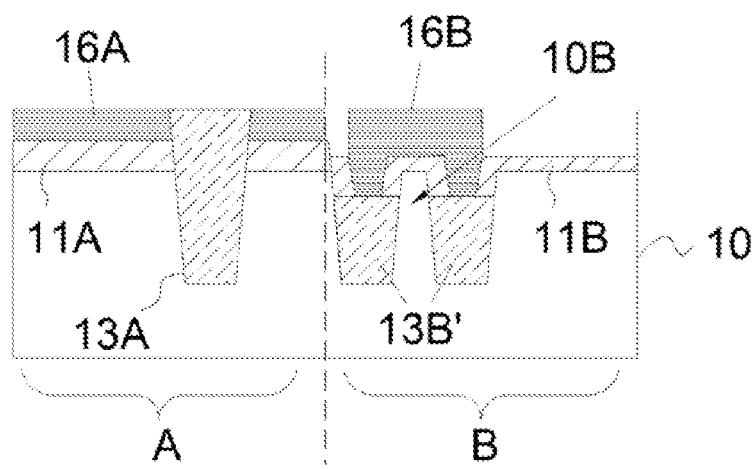

The cross-sectional structure diagram after completing step S106 is shown in FIG. 4N.

Specifically, the semiconductor protrusion 10B may be oxidized directly by a thermal oxidation process to form the supplement oxide layer on both sides of the semiconductor protrusion 10B. The corresponding supplement oxide layer and the portion 11B' of the second device oxide layer at the top of the semiconductor protrusion 10B as shown in FIG. 4M form the prolonged second device oxide layer 11B that surrounds the fin on three sides (i.e., the top and the two sides 1011B). The prolonged second device oxide layer 11B is used as the gate oxide layer for the FinFET.

Refer to FIG. 3, which is a flowchart of yet another method of fabricating a semiconductor device provided in an implementation of the present disclosure. After step S106, the method further includes the steps as follows.

In step S107, a first gate layer is formed on the first device oxide layer.

In step S108, a second gate layer is formed on the prolonged second device oxide layer.

The structure diagram after completing step S108 is shown in FIG. 4O, in which the first gate layer 16A may be patterned by etching to form the gate of planar transistor, and the second gate layer 16B is used as the gate of FinFET. The second gate layer 16B can surround the channel on three sides, so that the area for control of the channels by the gate is increased, and thus the ability of gate control is greatly enhanced. Accordingly, short channel effect may be inhibited effectively, and sub-threshold leakage current may be reduced. When the first gate layer 16A and the second gate layer 16B are both metal, they can be formed in different regions by the Low Pressure Chemical Vapor Deposition method. In this implementation, the low-voltage device region further includes the first low-voltage zone b1 and the second low-voltage zone b2. For a better illustration of the device structures formed in the first low-voltage zone b1 and the second low-voltage zone b2, refer to FIG. 4P, the FinFET in the first low-voltage zone and the FinFET in the second low-voltage zone are formed to be separated from each other, and the device oxide layers of the first low-voltage zone b1 and second low-voltage zone b2 may have the same thickness or different thicknesses, which may be configured according to the requirements of a different low-voltage zone with respect to breakdown voltage. The devices in the first low-voltage zone and the second low-voltage zone are formed by a method similar to the method of forming the devices in one low-voltage device region, and the device in the first low-voltage zone and the device in the second low-voltage zone may be formed simultaneously or separately.

In the methods of fabricating a semiconductor device provided in the present disclosure, the first shallow trench isolation structure and the second shallow trench isolation structures are formed respectively in the first region and the second region, and then two adjacent second shallow trench isolation structures are etched to form a semiconductor protrusion, so that the shallow trench isolation structures satisfying structural requirements of different regions can be formed in the semiconductor device, and the semiconductor protrusion can facilitate the formation of FinFET in the semiconductor device, reducing short channel effect.

Figure 4P:
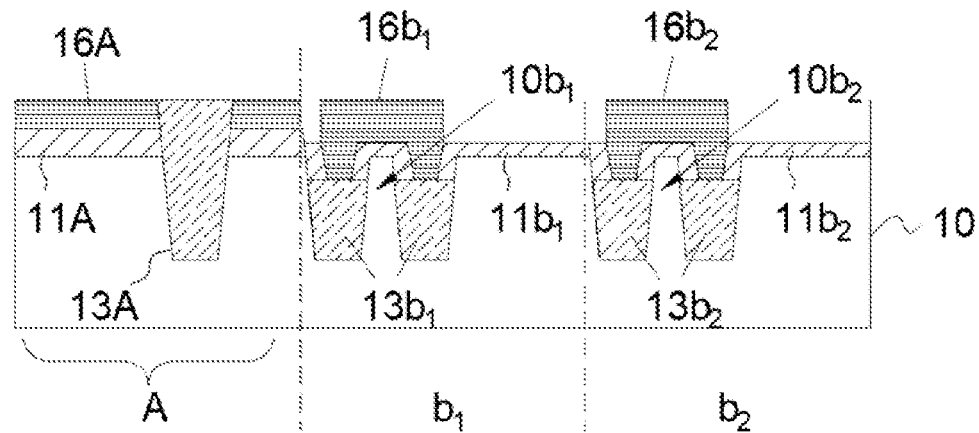

Refer to FIGS. 4A-4P, a semiconductor device is further provided by the present disclosure. The semiconductor device may be fabricated by the method described above, and may be used as a peripheral circuit of a memory device. Particularly, the memory device may be an NAND chip. The semiconductor device includes the substrate 10, the first shallow trench isolation structure 13A. The trench isolation structures 13B', the semiconductor protrusion 10B, the first device oxide layer 11A, the second device oxide layer 11B, the first gate layer 16A, and the second gate layer 16B.

Specifically, as shown in FIG. 4A, the substrate 10 may be a semiconductor material, for example, silicon, germanium, silicon-on-insulator (SOI), or the like. In this implementation, the substrate 10 may include a first region (region A) and a second region (region B), wherein the region A includes a high-voltage device region and may be used to form planar transistor in accordance with the implementation of the present disclosure, and the region B includes a low-voltage device region (the devices therein having an operating voltage lower than that of the devices in the high-voltage device region) that further includes a first low-voltage zone b1 and a second low-voltage zone b2. The operating voltage of devices (such as transistors or CMOS transistors) in the high-voltage device region, the first low-voltage region and the second low-voltage region can decrease in sequence. In this implementation, to simplify the illustration, in the figures after FIG. 4A, zones b1 and b2 are generally designated by the region B. Specifically, the region B may be one low-voltage device region or may include both the zone b1 and the zone b2. FIGS. 4B-4O will be described with the region B including one low-voltage device region taken as an example. The region B is used to form FinFET in accordance with the implementation of the present disclosure. In the FinFET, the gate may surround the channel on three sides, so that the area of the gate to control the channel is increased and thus the control ability of the gate is greatly enhanced. As a result, short channel effect may be inhibited effectively, and sub-threshold leakage current may be reduced. The performance of different device regions can be adjusted by changing the channel width of one or more transistors inside the device, and the channel width of the FinFET is in direct proportion to the height of its fin. Since the high-voltage device region requires relatively high driving voltage, the fin of the corresponding FinFET will be relatively high. It is difficult to form gate structure surrounding the higher fin on three sides, and as a result, the planar transistor is still used in the region A.

As shown in FIG. 4B, the first device oxide layer 11A in the first region and the second device oxide layer 11B in the second region are formed on the substrate 10, and the thickness $H_1$ of the first device oxide layer 11A in the first direction (the y direction in the figure) is larger than the thickness $H_2$ of the second device oxide layer 11B in the first direction.

Specifically, in this implementation, the first device oxide layer 11A and the second device oxide layer 11B are formed using processes including thermal oxidation, soft plasma oxidation, or UV photo assistant oxidation. When the substrate 10 is a silicon substrate as an option in this example, optionally the first device oxide layer 11A and the second device oxide layer 11B may be formed simultaneously. At this point, both the first device oxide layer 11A and the second device oxide layer 11B have the composition which is silicon oxide. The first device oxide layer 11A and the second device oxide layer 11B are used as the gate oxide layers of the high-voltage device and low-voltage device, respectively. Since the low-voltage device and high-voltage device have different requirements with respect to breakdown voltage, in order to avoid too big a leakage current in the high-voltage device region, the thickness $H_1$ of the first device oxide layer 11A in the first direction (the y direction in the figure), i.e. in the direction of the thickness of the substrate 10, is larger than the thickness H2 of the second device oxide layer 11B in the first direction. To achieve their corresponding relationship in thickness, the first device oxide layer 11A and the second device oxide layer 11B may be formed in the same step or in separate steps. When they are formed in the same step, the region A is doped with chlorine ions in advance, and an oxidation of the substrate 10 in the region A is accelerated due to the doping of chloride ions in the region A. As a result, the first device oxide layer 11A is formed to be thicker than the second device oxide layer 11B for the same amount of time. When they are formed in separate steps, in the first step, the device oxide layer with the same thickness is formed in both the first region and the second region under the same time and process conditions; and in the second step, the device oxide layer in the second region is selected to be etched, making the thickness of the second device oxide layer in the second region smaller than the thickness of the first device oxide layer in the first region. In this implementation, as shown in FIG. 4O, the second device oxide layer 11B surrounds the semiconductor protrusion 10B at its top and both sides, i.e., surrounds the fin of FinFET on three sides, and thus serves as the gate oxide layer for the FinFET.

The first shallow trench isolation structure 13A and the second shallow trench isolation structures 13B' are located in the first region and the second region, respectively. Since the first shallow trench isolation structure 13A and the second shallow trench isolation structures 13B may have the same height, the trench isolation structures 13B' obtained after etching the second shallow trench isolation structures 13B have a height smaller than that of the first shallow trench isolation structure 13A. Furthermore, in this implementation, the second shallow trench isolation structures 13B are etched below the substrate 10. As a result, the first shallow trench isolation structure 13A is above the substrate 10, which in turn is above the etched second shallow trench isolation structures 13B', so that the portion of the substrate 10 protruding from two adjacent etched second shallow trench isolation structures 13B' functions as a fin for FinFET in the B region, i.e., the semiconductor protrusion 10B in the region B functions as the fin for FinFET.

As shown in FIG. 4O, the semiconductor device further includes the first gate layer 16A on the first device oxide layer 11A and the second gate layer 16B on the second device oxide layer 12A.

In FIG. 4O, the first gate layer 16A may be patterned by etching to form the gate of planar transistor, and the second gate layer 16B may be used as the gate of FinFET. The second gate layer 16B can surround the channels on three sides, so that the area for control of the channel by the gate is increased and thus the ability of gate control is greatly enhanced. Accordingly, short channel effect may inhibited effectively and sub-threshold leakage current may be reduced. When the first gate layer 16A and the second gate layer 16B are both metal, they can be formed in different regions by the Low Pressure Chemical Vapor Deposition method. In this implementation, the low-voltage device region further includes the first low-voltage zone b1 and the second low-voltage zone b2. For better illustration of the device structures formed in the first low-voltage zone b1 and the second low-voltage zone b2, refer to FIG. 4P, the FinFET in the first low-voltage zone and the FinFET in the second low-voltage zone are formed to be separated from each other, and the device oxide layers of the first low-voltage zone b1 and second low-voltage zone b2 may have the same thickness or different thicknesses, which may be configured according to the requirements of a different low-voltage zone with respect to breakdown voltage. The devices in the first low-voltage zone and the second low-voltage zone are formed by a method similar to the method of forming the devices in one low-voltage device region, and the device in the first low-voltage zone and the device in the second low-voltage zone may be formed simultaneously or separately. The beneficial effects of the present disclosure are that, difference from existing technologies, in the semiconductor device and the fabrication method thereof provided in the present disclosure, the first shallow trench isolation structure and the second shallow trench isolation structures are formed respectively in the first region and the second region and then two adjacent second shallow trench isolation structures are etched to form the semiconductor protrusion, so that the shallow trench isolation structures satisfying structural requirements of different regions can be formed in the semiconductor device, and the semiconductor protrusion can facilitate the formation of FinFET in the semiconductor device, reducing short channel effect.

In addition to the above-described implementations, the present disclosure may have other implementations. All the technical solutions conceived through identical or equivalent substitutions fall within the scope claimed by the present disclosure.

In summary, although the present disclosure has been disclosed above with reference to some implementations, the implementations above are not used to limit the present disclosure. On the contrary, variations and modifications may be made by those of ordinary skills in the art without departing from the spirit and scope of the present disclosure. Accordingly, the present disclosure has its scope only defined by the appended claims.

What is claimed is:

1. A method of fabricating a semiconductor device, comprising:
   forming a first shallow trench isolation structure in a first region of a substrate and second shallow trench isolation structures in a second region of the substrate;
   forming a second mask layer over the substrate, the first shallow trench isolation structure, and the second shallow trench isolation structures; and
   etching a portion of the second mask layer, corresponding to the second shallow trench isolation structures, in the second region and a portion of the second shallow trench isolation structures in the second region sequentially to form a semiconductor protrusion between the second shallow trench isolation structures.

2. The method of claim 1, further comprising:
   forming a first mask layer on the substrate,
   wherein etching the portion of the second mask layer, corresponding to the second shallow trench isolation structures, in the second region and the portion of the second shallow trench isolation structures in the second region sequentially comprises:
   forming a second layer of photoresist on the second mask layer;
   etching the second layer of photoresist and the portion of the second mask layer in the second region sequentially, until the first mask layer and the second shallow trench isolation structures in the second region are exposed;
   removing the second layer of photoresist in the first region; and
   etching the portion of the second shallow trench isolation structures using the exposed first mask layer and the second mask layer remaining after the portion of the second mask layer is etched as a mask.

3. The method of claim 2, wherein forming the second layer of photoresist on the second mask layer comprises:
   forming a protecting layer on the second mask layer; and
   forming the second layer of photoresist on the protecting layer.

4. The method of claim 2, further comprising:
   forming, between the substrate and the first mask layer, a first device oxide layer in the first region and a second device oxide layer in the second region;
   after etching the portion of the second shallow trench isolation structures, removing the first mask layer and a remaining second mask layer; and
   forming a supplement oxide layer on both sides of the semiconductor protrusion to prolong the second device oxide layer.

5. The method of claim 4, wherein
   the second mask layer is silicon nitride or polysilicon; and
   when the second mask layer is polysilicon, removing the first mask layer and the remaining second mask layer comprises:

doping both sides of the semiconductor protrusion with carbon or germanium; and removing the remaining second mask layer and the first mask layer sequentially.

6. The method of claim 5, wherein doping the both sides of the semiconductor protrusion with carbon or germanium comprises:

forming a third mask layer on the remaining second mask layer; and doping the both sides of the semiconductor protrusion with carbon or germanium using the first mask layer in the second region and the third mask layer as a mask.

7. The method of claim 4, further comprising:

after the forming the supplement oxide layer on both sides of the semiconductor protrusion to prolong the second device oxide layer, forming a first gate layer on the first device oxide layer; and forming a second gate layer on the prolonged second device oxide layer.

8. The method of claim 4, wherein a thickness of the first device oxide layer in a first direction is larger than the thickness of the second device oxide layer in the first direction.

9. The method of claim 2, wherein forming the first shallow trench isolation structure in the first region of the substrate and the second shallow trench isolation structures in the second region of the substrate comprises:

forming an isolation trench in the substrate, the isolation trench comprising a first sub isolation trench in the first region and second sub isolation trenches in the second region; and filling the isolation trench with an isolation material to form the first shallow trench isolation structure and the second shallow trench isolation structures in the first region and the second region, respectively.

10. The method of claim 9, wherein filling the isolation trench with the isolation material comprises:

depositing the isolation material in the isolation trench and on the first mask layer to fully fill the isolation trench; and planarizing the isolation material to make the isolation material in the isolation trench flush with the first mask layer.

11. The method of claim 2, wherein a material of the first mask layer is silicon nitride.

12. The method of claim 2, wherein the second mask layer is silicon nitride or polysilicon; and when the second mask layer is polysilicon, forming the second mask layer over the substrate, the first shallow trench isolation structure, and the second shallow trench isolation structures comprises:

forming a buffer layer over the first mask layer, the first shallow trench isolation structure, and the second shallow trench isolation structures; and forming the second mask layer on the buffer layer.

13. The method of claim 12, wherein a thickness of the buffer layer ranges from 8 nm to 9 nm.

14. The method of claim 1, further comprising forming a planar transistor in the first region and a fin field-effect transistor (FinFET) in the second region.

15. The method of claim 1, wherein a top surface of the first shallow trench isolation structure is above a top surface of the substrate, and the top surface of the substrate is above a top surface of one of the second shallow trench isolation structures.

16. The method of claim 1, wherein after the portion of the second shallow trench isolation structures is removed, a top surface of the first shallow trench isolation structure is higher than a top surface of the semiconductor protrusion and a top surface of one of remaining second shallow trench isolation structures.

17. The method of claim 1, wherein another portion of the second mask layer is retained in the first region.

18. The method of claim 1, wherein a bottom surface of the first shallow trench isolation structure is at a same vertical level as a bottom surface of one of the second shallow trench isolation structures.

19. The method of claim 1, wherein forming the first shallow trench isolation structure in the first region of a substrate and the second shallow trench isolation structures in the second region of the substrate comprises:

filling a first material into a first sub isolation trench and filling a second material into second sub isolation trenches at a same process, the first material being identical to the second material.

20. The method of claim 1, wherein after the portion of the second shallow trench isolation structures is removed, a top surface of one of remaining second shallow trench isolation structures is below a top surface of the substrate.

* * * * *